United States Patent [19]

Wakai et al.

[11] Patent Number: 5,000,984
[45] Date of Patent: Mar. 19, 1991

[54] METHOD OF MAKING A MAGNETIC RECORDING MEDIUM

[75] Inventors: Kunio Wakai; Hideaki Niimi; Noboru Isoe, all of Ibaraki, Japan

[73] Assignee: Hitachi Maxell, Ltd., Osaka, Japan

[21] Appl. No.: 352,256

[22] Filed: May 16, 1989

Related U.S. Application Data

[62] Division of Ser. No. 145,599, Jan. 19, 1988, Pat. No. 4,855,175.

[30] Foreign Application Priority Data

Jan. 26, 1984 [JP]  Japan ................................. 59-12754
Jan. 26, 1984 [JP]  Japan ................................. 59-12755

[51] Int. Cl.⁵ ............................................ H01F 10/02
[52] U.S. Cl. ..................................... 427/132; 427/251; 427/255.3
[58] Field of Search ................................ 427/127–132, 427/48, 251, 255.3; 428/694, 900

[56] References Cited

U.S. PATENT DOCUMENTS

| | | | |
|---|---|---|---|
| 4,450,186 | 5/1984 | Shinohara | 427/42 |
| 4,477,489 | 10/1984 | Yanai et al. | 427/132 |
| 4,511,635 | 4/1985 | Nagao et al. | 428/694 |

*Primary Examiner*—Bernard Pianalto
*Attorney, Agent, or Firm*—Birch, Stewart, Kolasch & Birch

[57] ABSTRACT

A magnetic recording medium comprising a substrate and, as a recording layer, a ferromagnetic metal thin layer formed on the substrate by deposition, in which the ferromagnetic metal thin layer contains oxygen atom in such a manner that concentrations of oxygen atom in a surface layer and an interfacial layer adjacent to the substrate are higher than that in an intermediate layer between the surface and interfacial layers, which has an improved coercive force and smaller magnetic domain.

9 Claims, 6 Drawing Sheets

Average oxygen atom concentration (atomic %)

METHOD OF MAKING A MAGNETIC RECORDING MEDIUM

This application is a divisional of copending U.S. patent application Ser. No. 145,599, filed on Jan. 19, 1988 now U.S. Pat. No. 4,855,175.

BACKGROUND OF THE INVENTION

1. Field of the Invention

The present invention relates to a magnetic recording medium and production thereof. More particularly, it relates to a magnetic recording medium with improved magnetic properties comprising a substrate and, as a recording layer, a ferromagnetic metal thin layer containing oxygen atoms and a method for the production of the magnetic recording medium.

2. Discussion of Prior Art

Generally, a magnetic recording medium comprising a ferromagnetic metal thin layer as a recording layer is produced by vacuum deposition of ferromagnetic metal or an alloy thereof on a substrate such as a plastic film, while it turns around a peripheral surface of a cylindrical member installed in a vacuum deposition apparatus. To produce the magnetic recording medium with improved magnetic properties, the vaporized ferromagnetic metal is obliquely impinged on the substrate and simultaneously oxydizing gas is jetted into a stream of the vaporized metal near a position at which the vaporized metal is impinged on the substrate at the maximum impinging angle (cf. Japanese Patent Kokai Publication (unexamined) Nos. 41442/1983 and 83328/1983) or at the minimum impinging angle (cf. Japanese Patent Kokai Publication (unexamined) Nos. 41443/1983 and 83327/1983).

In the former method, however, the magnetic properties are not satisfactorily improved. Particularly, improvement of coercive force of the recording medium greatly depends on the deposition rate. As the deposition rate increases, the concentration of oxygen atoms contained in the ferromagnetic metal thin layer increases in the interfacial layer adjacent to the substrate and decreases at the surface of the thin layer. Therefore, the effect of the contained oxygen atom is not effectively exerted and it is difficult to produce a magnetic recording medium with improved magnetic properties at such a high deposition rate as is suitable for mass production.

Japanese Patent Kokai Publication (unexamined) No. 83327/1983 describes that the latter method provides a magnetic recording medium in which the concentration of oxygen atom contained in the ferromagnetic metal thin layer gradually increases from the interfacial layer to the surface. According to study by the present inventors, in the magnetic recording medium produced by this method the concentration of oxygen atom contained in the ferromagnetic metal thin layer decreases from the interfacial layer to the surface. Since the degree of decrease of the oxygen atom concentration is smaller than the former method, although the effect of the oxygen atom content is not as seriously effected as in the former method, still improvement of the magnetic properties is not satisfactory. Particularly, it is also difficult to produce the magnetic recording medium with the improved magnetic properties at such a high deposition rate as is suitable for mass production.

SUMMARY OF THE INVENTION

One object of the present invention is to provide a magnetic recording medium with improved magnetic properties.

Another object of the present invention is to provide a magnetic recording medium comprising a ferromagnetic metal thin layer as the recording layer with a high coercive force and small magnetic domain.

A further object of the present invention is to provide a magnetic recording medium with improved distribution of oxygen atom concentration in the ferromagnetic metal thin layer.

Still another object of the present invention is to provide an improved method for producing a magnetic recording medium comprising a ferromagnetic metal thin layer as the recording layer with a high coercive force and small magnetic domain, which method comprises obliquely impinging a vaporized ferromagnetic metal on a substrate and simultaneously jetting oxydizing gas on the substrate.

According to the present invention, there is provided a magnetic recording medium comprising a substrate and, as a recording layer, a ferromagnetic metal thin layer formed on the substrate by deposition, in which the ferromagnetic metal thin layer contains oxygen atoms in such a manner that concentration of oxygen atoms in a surface layer and an interfacial layer adjacent to the substrate are higher than that in an intermediate layer between the surface and interfacial layers, whereby the magnetic domain is made extremely small and the coercive force is greatly increased.

Further, there is provided a method for producing a magnetic recording medium of the present invention, which comprises impinging a ferromagnetic metal material at an oblique impinging angle on a substrate while turning the substrate around a peripheral surface of a cylindrical member from a point at which the stream of the vaporized metal material is impinged at a high impinging angle to a point at which the stream is impinged at a low impinging angle, and simultaneously jetting an oxydizing gas directly onto the substrate at least at the minimum impinging angle point, wherein an angle between the stream of the oxydizing gas jetted at the minimum impinging angle point and that of the vaporized ferromagnetic metal material is not greater than 30° and a central angle about the longitudinal axis of the cylindrical member of the directly jetted arc area of the substrate starting from the minimum impinging angle point toward a point at which the impinging angle is greater, is not greater than 10°, and optionally jetting an oxydizing gas directly into the substrate at least at the maximum impinging angle point from a direction which does not intersect the stream of the vaporized ferromagnetic metal and a central angle about the longitudinal axis of the cylindrical member of the directly jetted arc area of the substrate starting, from the maximum impinging angle point toward a point at which the impinging angle is smaller, is not greater than 20°.

DETAILED DESCRIPTION OF THE INVENTION

Figure 1:
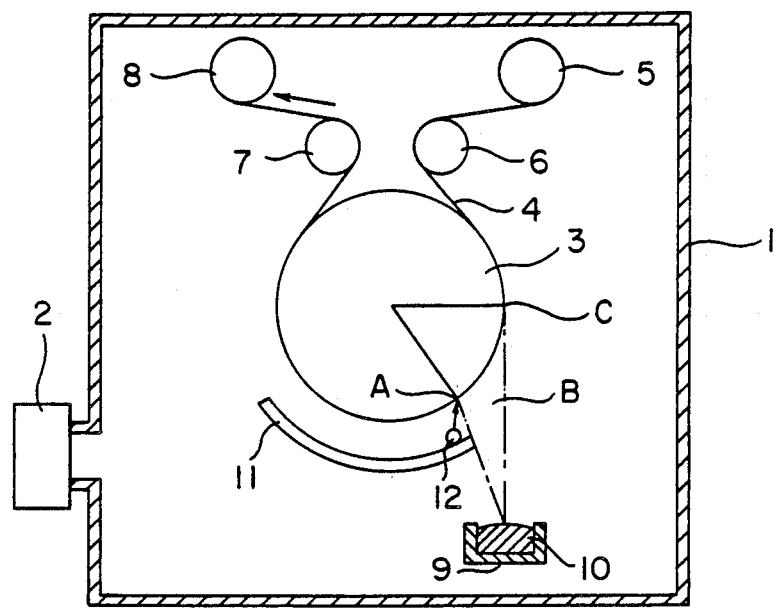
FIG. 1 is a schematic sectional view of a vacuum deposition apparatus suitable for practicing the method of the present invention.

The present invention is based on the study of the relationship between the distribution of the oxygen atom concentration through the thickness of the ferromagnetic metal thin layer and magnetic properties of the recording medium. In the conventional ferromagnetic metal thin layer in which the oxygen atom concentration decreases from the interfacial layer adjacent to the substrate toward the surface layer, although the oxygen atom concentration is high in the interfacial layer in which the magnetic interaction is weak due to large distance between the magnetic particles caused by a shadow effect of the oblique impingement, the oxygen atom concentration is low in the surface layer in which the magnetic interaction is strong due to narrow distance between the subsequently grown magnetic particles. Therefore, the effect of the contained oxygen atom is not effectively realized so that the high coercive force and good magnetic properties are not achieved. However, the oxygen atom concentration in the interfacial layer of the ferromagnetic metal thin layer is controlled by supplying enough oxygen when the nuclei of the magnetic particles are formed at the maximum impinging angle point and thereby the size of the slantingly grown particle having a curved pillar shape can be reduced. In addition, if the oxygen atom concentration in the surface layer at which the magnetic interaction is strong is made higher than that in an intermediate layer between the interfacial and surface layers, non-magnetic oxides are formed in the surface layer and the magnetic interaction is suppressed. Therefore, the effect of the contained oxygen atom is effectively realized so that the magnetic domain size is further minimized, and the magnetic properties are much improved.

In the specification, the surface layer of the ferromagnetic metal thin layer is intended to mean a surface layer which contains oxygen atom which is supplied by jetting the oxydizing gas and chemically bound to the ferromagnetic metal and to exclude a contaminated layer.

The oxygen atom concentration in the ferromagnetic metal thin layer is lowest in its intermediate layer. Preferably, that in the surface layer is 1.5 to 6.0 times that in the intermediate layer, and that in the interfacial layer is 1.2 to 3.0 times that in the intermediate layer. Preferably, the oxygen atom concentration in the intermediate layer is from 5 to 15% of the total number of all component atoms contained in the intermediate layer, and that in the whole ferromagnetic metal thin layer is from 10 to 30% of the total number of the component atoms contained in the whole layer. When the oxygen atom concentrations are in these ranges, the magnetic recording medium has the coercive force not lower than 800 oersted and the magnetic domain not greater than 0.3 micron. If the oxygen atom concentration in the interfacial layer is less than the above range, it is difficult to sufficiently reduce the size of the ferromagnetic metal particle which forms a nucleus. If the oxygen atom concentration in the surface layer is less than the above range, the non-magnetic oxide around the metal particles are not developed enough to obtain high coercive force and to reduce the size of the magnetic domain. If the oxygen atom concentration either in the interfacial or surface layer is higher than the above range, the magnetic properties may change for the worse.

In the specification, the whole ferromagnetic metal thin layer is intended to mean a layer which contains oxygen atom which is supplied by jetting the oxydizing gas and bound with the ferromagnetic metal and to exclude a skin layer contaminated by oxygen liberated from organic material or migrated from the air.

The magnetic recording medium of the invention may be produced by a method which comprises impinging a ferromagnetic metal material at an oblique impinging angle on a substrate while turned around a peripheral surface of a cylindrical member from a point at which the stream of the vaporized metal material is impinged at a high impinging angle toward a point at which the stream is impinged at a low impinging angle, and simultaneously jetting an oxydizing gas directly onto the substrate at least at the minimum impinging angle point, wherein an angle between the stream of the oxydizing gas jetted at the minimum impinging angle point and that of the vaporized ferromagnetic metal material is not greater than 30° and a central angle about the longitudinal axis of the cylindrical member of the directly jetted arc area of the substrate starting from the minimum impinging angle point toward a point at which the impinging angle is greater, is not greater than 10°. Optionally, an oxydizing gas is directly jetted into the substrate at least at the maximum impinging angle point from a direction which does not intersect the stream of the vaporized ferromagnetic metal and a central angle about the longitudinal axis of the cylindrical can of the directly jetted arc area of the substrate starting, from the maximum impinging angle point toward a point at which the impinging angle is smaller, is not greater than 20°.

In the present invention, specific examples of the substrate are a plastic film made of generally used polymers such as polyesters (e.g. polyethylene terephthalate, etc.), polyimides, polyamides, etc. and a metallic film made of a non-magnetic metal, such as copper.

Specific examples of the ferromagnetic metal material are a ferromagnetic metal, such as Co. Ni, Fe, etc., their oxides, an alloy containing at least one of them and their compounds, such as Co-P, Co-Ni-P, etc.

The present invention will be illustrated by making reference to the accompanied drawings by way of example.

FIG. 1 is a schematic sectional view of an embodiment of a vacuum deposition apparatus suitable for practicing the method of the invention in which the oxydizing gas is jetted on the substrate at or near the minimum impinging angle position. A vacuum chamber 1 is kept in vacuo by means of an evacuating system 2. A cylindrical member 3 is installed in the central part of the apparatus 1, and a substrate 4, such as a plastic film, is unwound from a roll 5, guided by a guide roll 6 and turned around the peripheral surface of the cylindrical member 3. Then, it is guided by another guide roll 7 and wound by a wind-up roll 8. Beneath the cylindrical member, a heating vessel 9 is placed, in which a ferromagnetic metal material 10 is contained and heated to vaporize. The vapor of the material 10 is obliquely impinged on the substrate 4 by means of a deposition-preventing plate 11 placed between the cylindrical member 3 and the vessel 9. Simultaneously with deposition of the material 10, an oxydizing gas is jetted on the substrate 4 at least at a minimum impinging angle point A from a gas inlet nozzle 12 placed between the member 3 and the plate 11.

Figure 2:
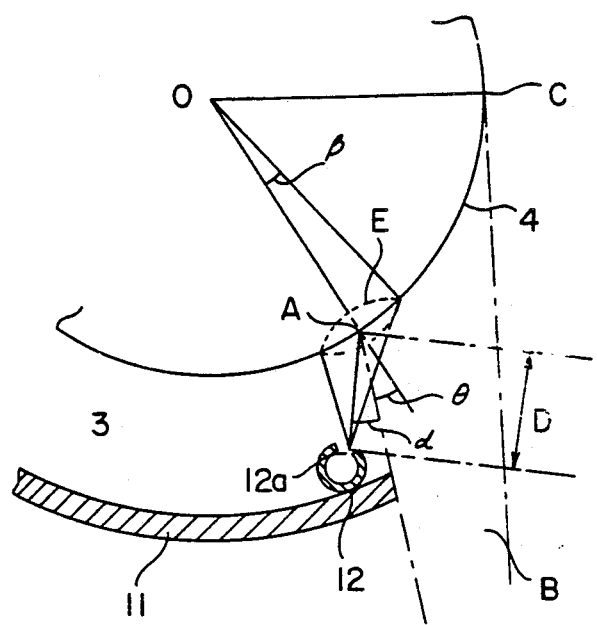
FIG. 2 is an enlarged sectional view of the main part of the apparatus of FIG. 1.

As shown in FIG. 2, the position of the nozzle 12 is so selected that the distance D from the supply opening 12a to the position A is not longer than 15 cm and the angle $\alpha$ between the stream of the oxydizing gas and the stream B of the vaporized metal material impinged by the minimum impinging angle $\theta$ is not greater than 30°. Further, the central angle $\beta$ about the longitudinal axis O of the cylindrical member 3 of the directly jetted arc area E of the substrate starting from the minimum impinging angle point A toward a point at which the impinging angle is greater, is not greater than 10°. When the oxydizing gas is jetted on the substrate at least at the minimum impinging angle point A under such conditions, the concentration of oxydizing gas is maximum near the point A and, in addition, oxygen filled in the chamber 1 tends to be trapped in the ferromagnetic metal thin layer in a relatively high concentration near the maximum impinging angle point C since the deposition rate of the ferromagnetic metal material is lower near the point C. As the result, on the one hand, when the nuclei of the particles of the ferromagnetic material are formed on the substrate 4 near the point C, particles having a sufficiently small size and containing comparatively large amount of oxygen atom are formed. On the other hand, particles are suitably grown near the point A due to rich oxygen and the deposited ferromagnetic metal material contains a sufficient amount of oxygen atom at a part in which magnetic interaction increases as the particles grow to form a ferromagnetic metal thin layer having a small magnetic domain and high coercive force. In the thus formed ferromagnetic metal thin layer, since the oxygen atom concentration in the interfacial layer and that in the surface layer are high, magnetization tends to direct in a direction perpendicular to the substrate, which is suitable for high density recording, and the distribution of the oxygen atom concentration is idealized, that is, the oxygen atom concentration in the intermediate layer is lowest and that in the interfacial layer is higher than that in the intermediate layer and lower than that in the surface layer. Thereby, a magnetic recording medium having improved magnetic properties is produced.

Since a large amount of the oxydizing gas is jetted at least at the minimum impinging angle point A, oxygen atom is trapped by the ferromagnetic metal material in a higher concentration and the coercive force is increased more as the deposition rate is increased. Therefore, the magnetic recording medium having sufficiently improved magnetic properties, for example, a magnetic domain of not larger than 0.3 micron can be produced under conditions suitable for mass production, that is, under the conditions in which the minimum impinging angle of the vaporized ferromagnetic metal material is not greater than 60° and the deposition rate is not lower than 1,000 Å/sec. If the minimum impinging angle of the vaporized material is greater than 60°, the efficiency of deposition is deteriorated and unsuitable for mass production. In addition, any impinging disturbance between the oxydizing gas and the vaporized ferromagnetic metal material hardly occurs, and the impinging angle does not fluctuate, which is often found in the conventional method comprising jetting the oxydizing gas into the stream of the vaporized ferromagnetic metal material.

Figure 3:
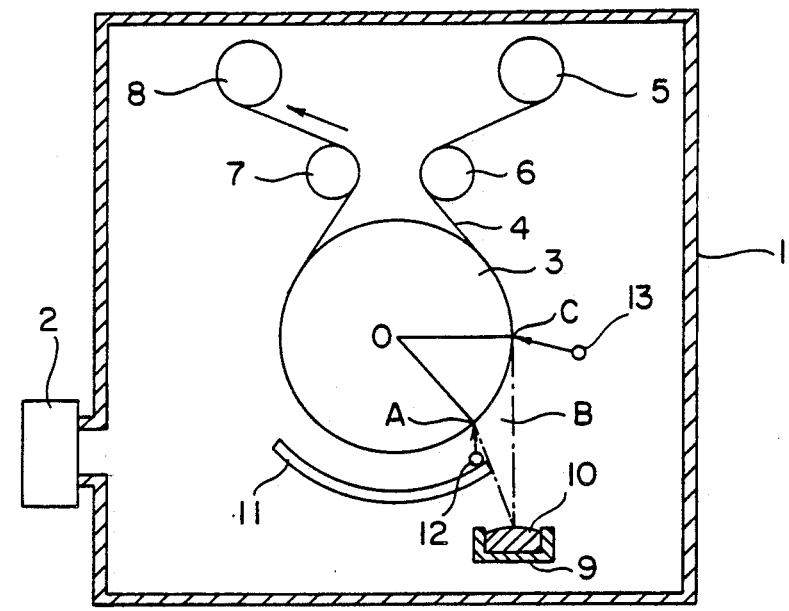
FIG. 3 is a schematic sectional view of another vacuum deposition apparatus suitable for practicing the modified method of the present invention.

FIG. 3 shows another vacuum deposition apparatus suitable for practicing the improved method of the invention. This apparatus has substantially the same construction as that of FIG. 1 except that the apparatus of FIG. 3 further comprises a gas inlet tube 13 near the maximum impinging angle point C and the oxydizing gas is jetted from the nozzle 13 on the substrate near the point C.

Figure 4:
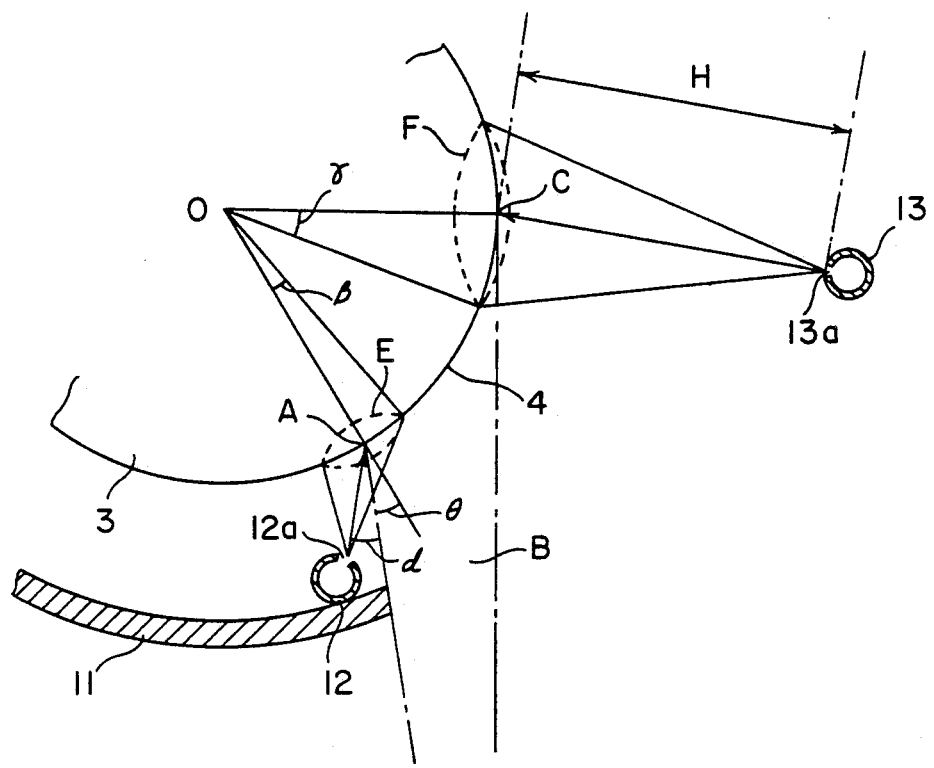
FIG. 4 is an enlarged sectional view of the main part of the apparatus of FIG. 3, FIGS. 5 and 6 are each a schematic view of a vacuum deposition apparatus for producing a conventional magnetic recording medium.

As shown in FIG. 4, the position of the nozzle 13 is so selected that the distance H from the supply opening 13a to the position C is not larger than 50 cm, and the central angle $\gamma$ about the longitudinal axis O of the cylindrical member 3 of the directly jetted arc area F of the substrate starting from the maximum impinging angle point C toward a point at which the impinging angle is smaller, is not greater than 20°. In the apparatus of FIG. 3, since the oxydizing gas is jetted from the nozzle 13 on the substrate near the maximum impinging angle point C, the size of the particle nucleus of the ferromagnetic metal is more easily controlled to obtain smaller particle, and oxygen atom is trapped in the interfacial layer at a higher concentration.

As the oxydizing gas, pure oxygen gas or a mixture of oxygen and a diluent gas (e.g. nitrogen, etc.) is preferably used.

PREFERRED EMBODIMENTS

The present invention will be hereinafter explained further in detail by following Examples.

EXAMPLE 1

The vacuum deposition apparatus of FIG. 1 installed with the cylindrical can 3 of 60 cm in diameter was used. A base film 4 of polyethylene terephthalate was travelled around the peripheral surface of the rotating cylindrical can 3 through the guide roll 6 and wound by the wind-up roll 8 through the guide roll 7. On the other hand, an alloy 10 of cobalt and nickel in a weight ratio of 8:2 was charged in the vessel 9. Then, the chamber 1 was evacuated by the system 2 to a pressure of about $5 \times 10^{-5}$ torr. and the alloy was heated to evaporate and obliquely impinged on the substrate with the minimum impinging angle of 50° at the deposition rate of 800 Å/sec. Simultaneously, the oxygen gas was jetted from the nozzle 12 on the film 4 at the minimum impinging angle point A with varying the oxygen pressure in the chamber. The distance D between the opening 12a of the nozzle 12 and the point A was 5 cm, and the angle and direction of the oxygen gas was so selected that the angle α was 20° and the angle β was 10°. In this manner, the ferromagnetic metal thin layer containing the Co-Ni alloy was formed on the base film 4 and cut in the form of plural magnetic recording tapes each having the predetermined width.

EXAMPLE 2

In place of the apparatus used in Example 1, the vacuum deposition apparatus of FIG. 3 was used, and the ferromagnetic metal thin layer was formed on the base film in the same manner as in Example 1 except that the oxygen gas was also jetted from the nozzle 13 on the base film 4 at the maximum impinging angle point C with varying the pressure of the jetted gas, and plural magnetic recording tapes were produced. The distance H between the opening 13a of the nozzle 13 and the point C was 15 cm, and the angle and direction of the oxygen gas was so selected that the angle γ was 20°.

COMPARATIVE EXAMPLE 1

Figure 5:
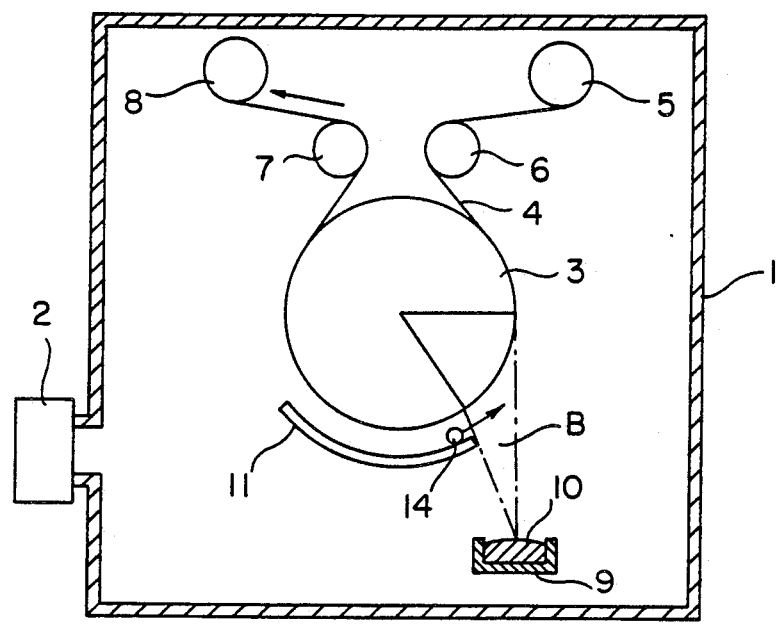

In place of the apparatus used in Example 1, the apparatus of FIG. 5 was used, which has substantially the same construction as that of FIG. 1 except that the gas inlet nozzle 14 was placed between the cylindrical can 3 and the plate 11 in place of the nozzle 12 so that the gas was jetted in the direction shown by the arrow into the stream B of the vaporized ferromagnetic metal material but not directly on the base film 4. In this manner, the ferromagnetic metal thin layer was formed on the base film, and plural magnetic recording tapes were produced.

COMPARATIVE EXAMPLE 2

Figure 6:
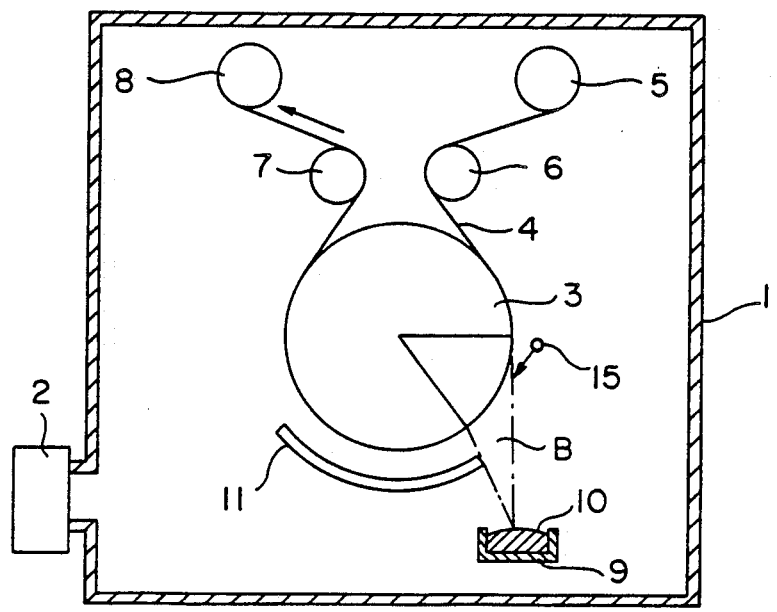

In place of the apparatus used in Example 1, the apparatus of FIG. 6 was used, which has substantially the same construction as that of FIG. 1 except that the gas inlet nozzle 15 was placed near the maximum impinging angle point C in place of the nozzle 12 so that the gas was jetted in the direction shown by the arrow into the stream B of the vaporized ferromagnetic metal material but not directly on the base film 4. In this manner, the ferromagnetic metal thin layer was formed on the base film and plural magnetic recording tapes were produced.

Figure 7:
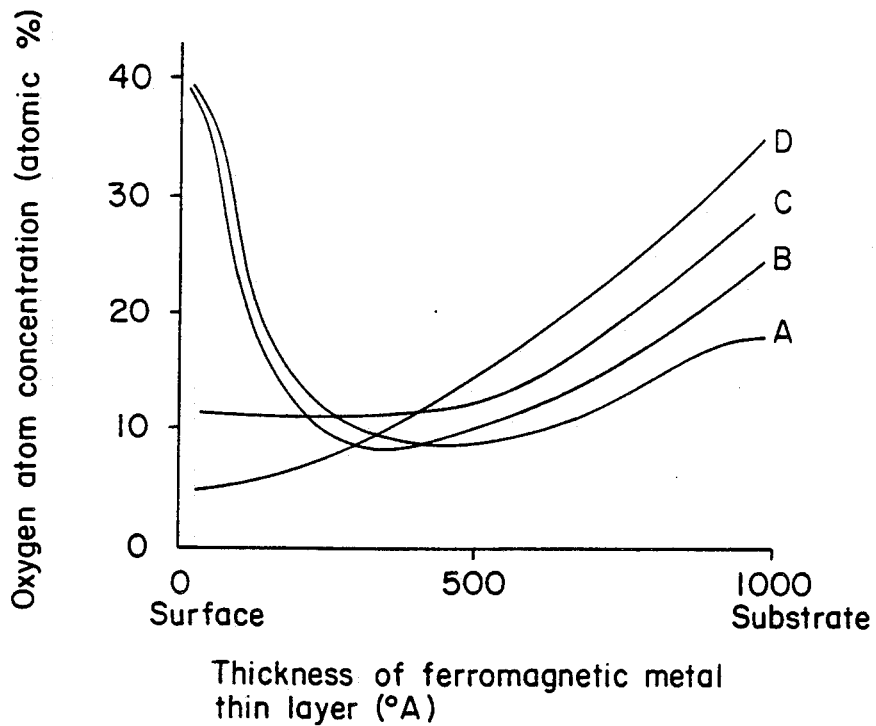
FIG. 7 shows the distributions of the oxygen atom concentration in the ferromagnetic metal thin layers of the magnetic recording mediums produced in Examples and Comparative Examples.

The magnetic recording tapes produced in Examples and Comparative Examples under the constant oxygen pressure of $2 \times 10^{-4}$ torr. were examined for distribution of oxygen atom concentration with an Auger electron spectrometer. The results are shown in FIG. 7, in which Curves A, B, C and D correspond to the tapes produced in Example 1, Example 2, Comparative Example 1 and Comparative Example 2, respectively.

As is clear from these results, while, in the recording tapes produced in Comparative Examples, oxygen atom was contained in the ferromagnetic metal thin layer with gradually decreasing concentration from the interfacial layer to the surface layer, in the recording tapes produced in Examples, oxygen atom concentration was highest in the surface layer, next highest in the interfacial layer and lowest in the intermediate layer.

The coersive force and the magnetic domain size were measured of the magnetic recording tapes produced in Examples and Comparative Examples. The results are shown in FIGS. 8 and 9.

Figure 8:
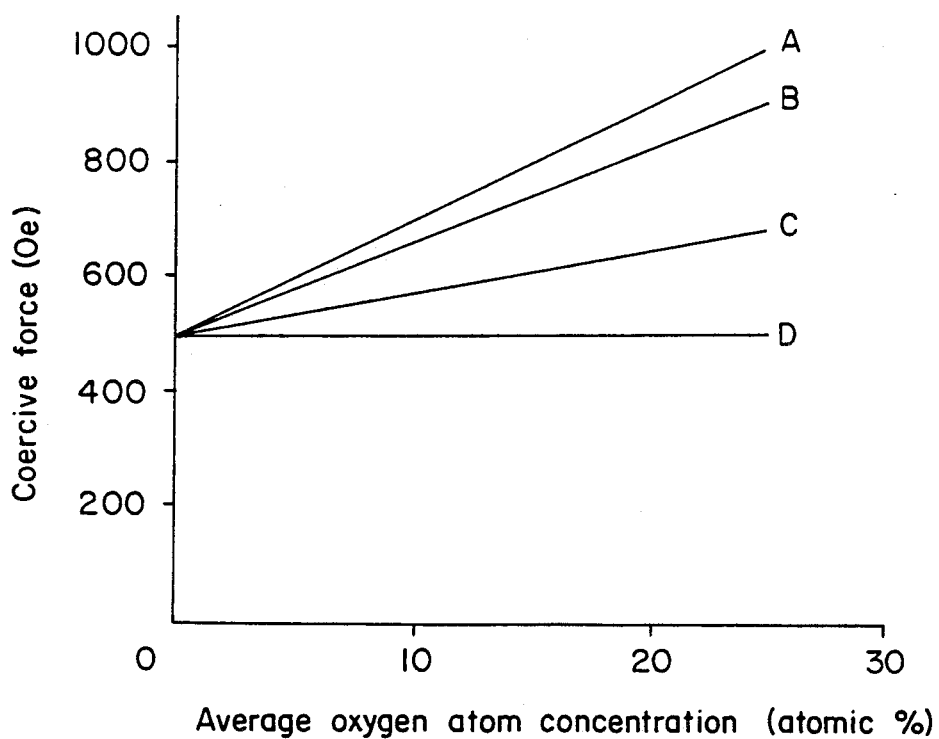
FIG. 8 shows relationships between the coercive force and the average oxygen atom concentration of the magnetic recording mediums produced in Examples and Comparative Examples.

FIG. 8 shows the relationship between the coercive force and the average oxygen atom concentration in the whole ferromagnetic metal thin layer. Curves A to D correspond to the tapes produced in Example 1, Example 2, Comparative Example 1 and Comparative Example 2, respectively.

Figure 9:
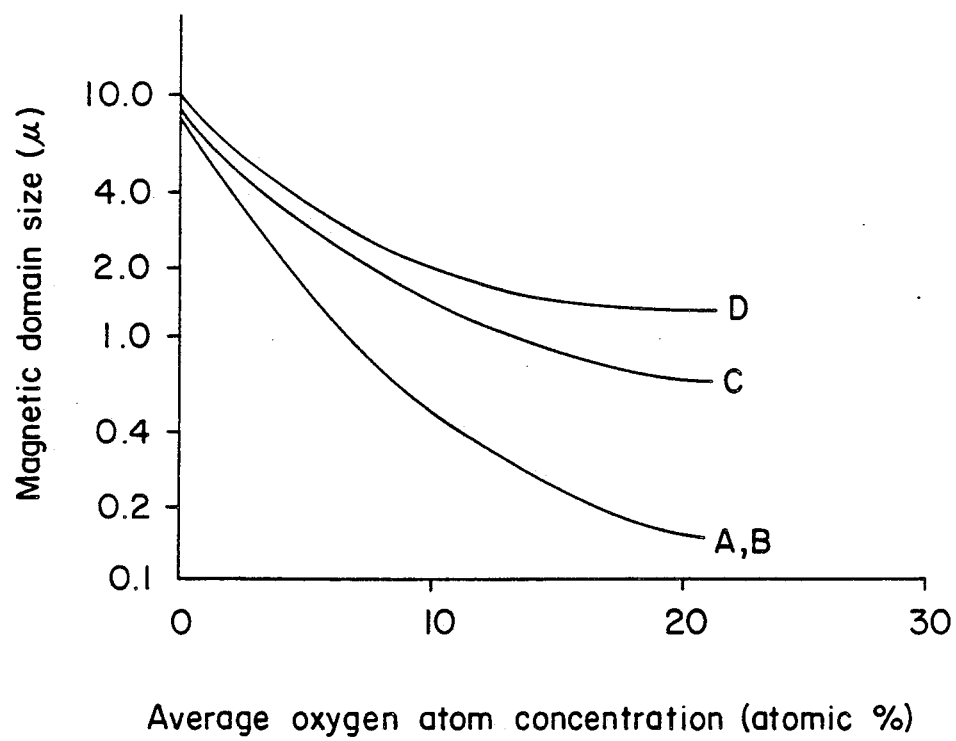
FIG. 9 shows relationships between the size of magnetic domain and the average oxygen atom concentration of the magnetic recording mediums produced in Examples and Comparative Examples.

FIG. 9 shows the relationship between the size of the magnetic domain and the average oxygen atom concentration in the whole ferromagnetic metal thin layer. Curves A to D correspond to the tapes produced in Example 1, Example 2, Comparative Example 1 and Comparative Example 2, respectively.

As is seen from the results shown in FIGS. 8 and 9, the magnetic recording tapes of the invention produced in Examples had high coercive force and smaller magnetic domain than those produced in Comparative Examples.

Figure 11:
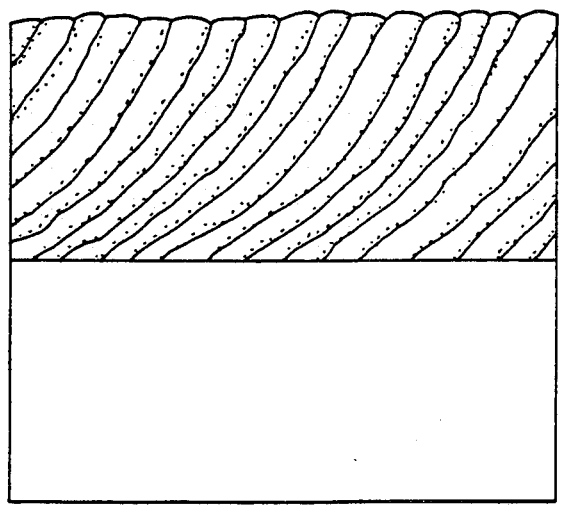
FIG. 11 is a schematic diagram of the cross section of the electron microscope photograph of FIG. 10.
Figure 10:
FIG. 10 is an electron microscope photograph of a cross section of the magnetic recording medium of the present invention.

The electron microscope photograph of the cross section of the magnetic recording medium of the present invention of FIG. 10 and the schematic thereof represented by FIG. 11 illustrates the curved pillar shape of the slantingly grown particles characteristic of the thin ferromagnetic layer of the magnetic recording medium of the present invention.

While the coercive force of the magnetic recording tape produced by the conventional methods is 700 oersted or less and its magnetic domain is 0.5 micron or larger, the coercive force of the magnetic recording tape of the invention is not lower than 800 oersted, particularly up to 1,000 oersted and its magnetic domain is not larger than 0.3 microns.

The invention being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for producing a magnetic recording medium which comprises:
   providing a substrate,
   providing a source of a ferromagnetic material,
   providing a plate between said substrate and said source of ferromagnetic material;
   forming a thin ferromagnetic metal recording layer on a surface of said substrate by obliquely depositing a stream of vaporized ferromagnetic metal material at an oblique impinging angle onto said surface of said substrate as said substrate traverses around a peripheral surface of a cylinder from a point at which said stream of said vaporized metal material is impinged at a high impinging angle to a point at which said stream is impinged at a low impinging angle, said oblique deposition of said ferromagnetic material resulting from the presence of said plate, and simultaneously jetting an oxydizing gas directly onto said substrate from a gas jetting means placed between said substrate and said plate at least at said minimum impinging angle point, such that an angle between said stream of oxydizing gas jetted at said minimum impinging angle point and that of said vaporized ferromagnetic metal material is not greater than 30° and a central angle about a longitudinal axis of said cylinder of a directly jetted arc area of said substrate starting from said minimum impinging angle point toward a point at which said impinging angle is greater, is not greater than 10°.

2. A method according to claim 1, which further includes jetting an oxydizing gas directly onto said substrate at least at a maximum impinging angle point from a direction which does not intersect said stream of vaporized ferromagnetic metal and a central angle about said longitudianl axis of said cylinder of a directly jetted arc area of said substrate starting from said maximum impinging angle point toward a point at which said impinging angle is smaller, is not greater than 20°.

3. The method of claim 1, wherein a minimum impinging angle of said ferromagnetic metal material is not greater than 60°.

4. The method according to claim 1, wherein a deposition rate of said ferromagnetic material is not lower than 1000 Å per second.

5. The method of claim 1, wherein said thin ferromagnetic metal recording layer has an oxygen atom concentration in a surface layer of said metal layer and in an interface layer adjacent to said substrate higher than that in an intermediate area between said surface and said interface layer and wherein said oxygen atom concentration in said surface layer being from 1.5 to 6.0 times that of said intermediate area and said oxygen atom concentration in said interface layer being from 1.2 to 3.0 times that of said intermediate area, the ratio of oxygen atom concentration in said surface layer to that in said interface layer being from 0.50 to 5.0, said oxygen atom concentration in said intermediate area being from 5 to 15% of the total number of all component atoms contained in said intermediate area, and the oxygen atom concentration in the whole of said thin ferromagnetic metal layer being from 10 to 30% of the total number of the component atoms contained in said whole layer, said thin ferromagnetic metal layer having a coercive force of not lower than 800 oersteds, and a magnetic domain of not greater than 0.3 micron.

6. The method of claim 5, wherein said thin ferromagnetic metal layer comprises a metal selected from at least one member of the group consisting of Co, Ni, Fe and an alloy containing at least one of said Co, Ni and Fe.

7. The method of claim 5, wherein said oxygen atom concentration in the whole of the thin ferromagnetic metal layer is from 15 to 30% of the total number of the component atoms contained in the whole layer.

8. The method of claim 1, wherein said substrate is a plastic film.

9. The method of claim 1, wherein said thin film ferromagnetic metal layer formed on said substrate consists essentially of slantingly grown particles having a curved pillar shape, in which said thin ferromagnetic metal layer has an oxygen atom concentration in a surface layer of said metal layer and in an interface layer adjacent to said substrate higher than that in an intermediate area between said surface and said interface layer and wherein said oxygen atom concentration in said surface layer being from 1.5 to 6.0 times that of said intermediate area and said oxygen atom concentration in said interface layer being from 1.2 to 3.0 times that of said intermediate area, the ratio of oxygen atom concentration in said surface layer to that in said interface layer being as defined from the oxygen atom concentration on curve B of FIG. 7 to 5.0, said oxygen atom concentration in said intermediate area being from 5 to 15% of the total number of all component atoms contained in said intermediate area, and the oxygen atom concentration in the whole of said thin ferromagnetic metal layer being from 10 to 30% of the total number of the component atoms contained in said whole layer, said thin ferromagnetic metal layer having a coercive force of not lower than 800 oersteds, and a magnetic domain of not greater than 0.3 micron.

* * * * *